United States Patent
Chen et al.

(10) Patent No.: US 8,392,777 B2
(45) Date of Patent: Mar. 5, 2013

(54) CENTRALIZED MBIST FAILURE INFORMATION

(75) Inventors: Wei-Yu Chen, Fremont, CA (US);
Kevin B. Badgett, Campbell, CA (US);
Siegfried Kay Hesse, Dresden (DE);
Timothy J. Wood, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 723 days.

(21) Appl. No.: 12/549,164

(22) Filed: Aug. 27, 2009

(65) Prior Publication Data

US 2011/0055644 A1    Mar. 3, 2011

(51) Int. Cl.
*G01R 31/28* (2006.01)
(52) U.S. Cl. ........................ 714/733; 714/718
(58) Field of Classification Search .................. 365/200, 365/201; 702/118; 714/30, 718, 733
See application file for complete search history.

(56) References Cited

U.S. PATENT DOCUMENTS

| | | | |
|---|---|---|---|
| 6,259,637 B1 | 7/2001 | Wood et al. | |
| 6,373,758 B1 * | 4/2002 | Hughes et al. | 365/200 |
| 6,560,740 B1 | 5/2003 | Zuraski, Jr. et al. | |
| 6,691,252 B2 * | 2/2004 | Hughes et al. | 714/30 |
| 6,928,377 B2 * | 8/2005 | Eustis et al. | 702/118 |
| 7,313,739 B2 * | 12/2007 | Menon et al. | 714/718 |
| 7,571,367 B2 * | 8/2009 | Selva et al. | 714/733 |
| 7,646,655 B2 * | 1/2010 | Mondello et al. | 365/201 |
| 2007/0204190 A1 | 8/2007 | Hesse et al. | |

* cited by examiner

*Primary Examiner* — David Ton
(74) *Attorney, Agent, or Firm* — Zagorin O'Brien Graham LLP

(57) ABSTRACT

Failure and repair information collected during self-testing of arrays in an integrated circuit is stored in a centralized array in the integrated circuit. In that way, a centralized array can be read out to provide failure and repair information on the arrays in the integrated circuit rather than having to read from each array. In addition, the failure and repair information may also be stored in the array under test for certain of the arrays.

19 Claims, 5 Drawing Sheets

US 8,392,777 B2

CENTRALIZED MBIST FAILURE INFORMATION

BACKGROUND

1. Field of the Invention

This application relates to testing of integrated circuits and more particularly to testing storage arrays in integrated circuits.

2. Description of the Related Art

Integrated circuits such as microprocessors (such as, but not limited to, central processing units and graphics processing units) typically contain multiple storage arrays. For modern microprocessors, the storage arrays may range from large instruction and data caches to small register files. Part of the process of manufacturing such integrated circuits involves testing the arrays and determining if any of the arrays have failures. The tests typically involve writing data to the memory and reading back the data to determine if the write was successful. Various patterns may be written to the arrays. Some data patterns may be better at uncovering certain failures depending upon the particular memory technology.

Once the tests have been completed, the results need to be stored in order to be utilized in failure analysis and possible repair of the failed arrays. In the past, failure information and repair data collected during test have been stored in the array under test itself. For integrated circuits with hundreds of arrays, that may result in the need to read hundreds of different arrays to determine whether there is a need to fix the array being read and the failure information necessary to fix the array.

SUMMARY OF EMBODIMENTS OF THE INVENTION

Accordingly, in an embodiment of the invention, test information, including, e.g., failure and repair information collected during testing, is stored in a centralized array. In that way, a centralized location can be read out to provide failure and repair information on all the arrays in the integrated circuit rather than having to read from multiple arrays. In addition, the failure and repair information may also be stored, in the array under test where possible.

In one embodiment, a method is provided that includes storing the test information from each of a plurality of arrays in an integrated circuit into a centralized array in the integrated circuit. The method may further include, writing respective portions of the test information associated with one or more of the storage arrays, into the one or more of the storage arrays, in addition to the centralized array.

In a second embodiment, an integrated circuit includes a plurality of storage arrays. A first plurality of first test control logic circuits are respectively coupled to one or more of the storage arrays. A second test control logic circuit is coupled to a particular one of the storage arrays. The second test control logic circuit is coupled to supply test results of the plurality of the storage arrays to the particular one of the storage arrays.

In still another embodiment, a method of manufacturing an integrated circuit is provided that includes storing test information, including failure and repair information from each of a plurality of arrays in an integrated circuit into a common array in the integrated circuit, retrieving the test information from the centralized array, and using the retrieved test information to repair one or more of the arrays.

BRIEF DESCRIPTION OF THE DRAWINGS

The present invention may be better understood, and its numerous objects, features, and advantages made apparent to those skilled in the art, by referencing the accompanying drawings.

The use of the same reference symbols in different drawings indicates similar or identical items.

DESCRIPTION OF THE PREFERRED EMBODIMENT(S)

Figure 1:
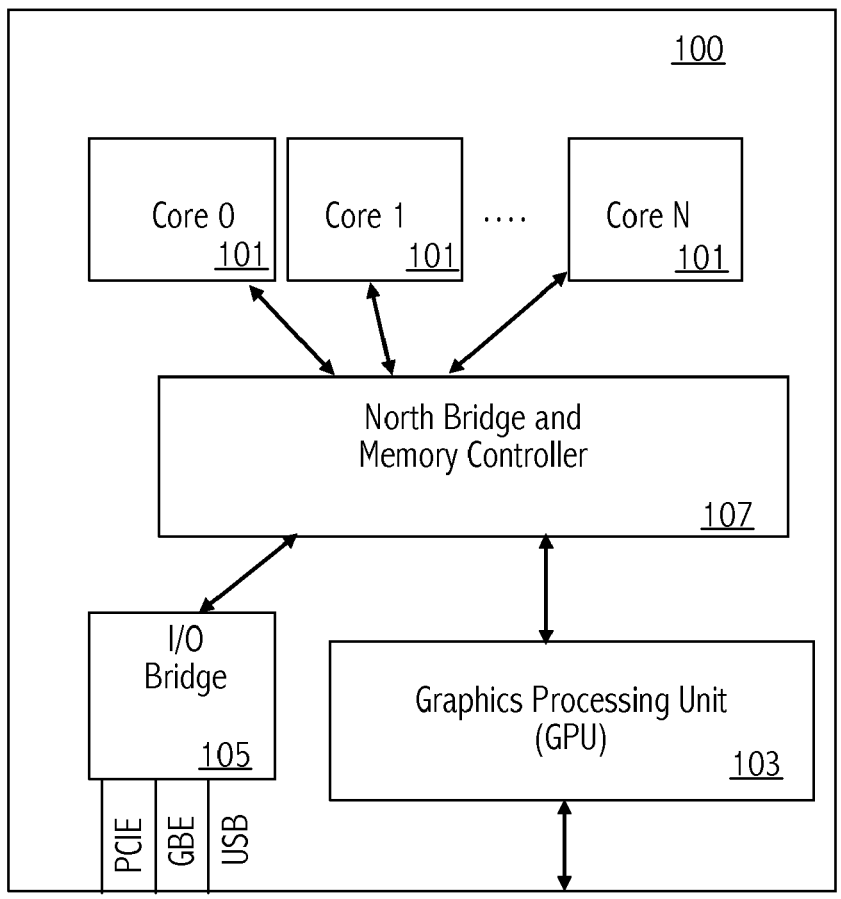
FIG. 1 illustrates an exemplary integrated circuit suitable for incorporating an embodiment of the invention.

Referring to FIG. 1, illustrated is an exemplary multi-core processor integrated circuit 100 that can exploit embodiments of the invention. The multi-core processor includes multiple storage arrays in each core 101 and the graphics processing unit (GPU) including, e.g., data and instruction caches, register files and other arrays. Given the large number of arrays and the large size of some of the arrays, in order to provide efficient testing of the embedded arrays, memory built-in self-test (MBIST) techniques are used in which built-in self-test control logic causes various patterns to be written to the array under test and then read back to determine if the arrays could be successfully written and read. Particular patterns may be used, e.g., random patterns or alternating 1s and 0s or walking 1s and/or 0s, which are helpful in identifying particular faults in the array, such as stuck-at or stuck-open faults.

Figure 2:
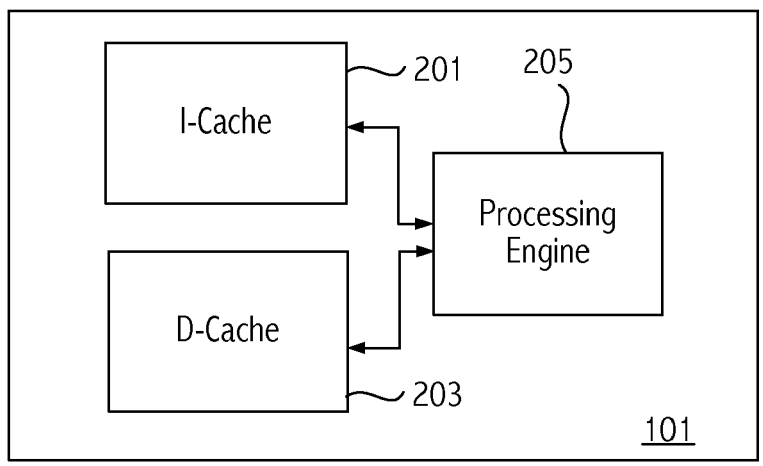
FIG. 2 illustrates a simplified exemplary block diagram of one of cores 101 showing the cache arrays.

FIG. 2 illustrates a simplified exemplary block diagram of one of cores 101 illustrating the cache arrays. Core 101 includes instruction cache 201, data cache 203, and processing engine 205. Of course, multiple caches may be provided as well as other kinds of arrays. In fact, hundreds of separate arrays are typically included in a modern multi-core processor.

Figure 3A:
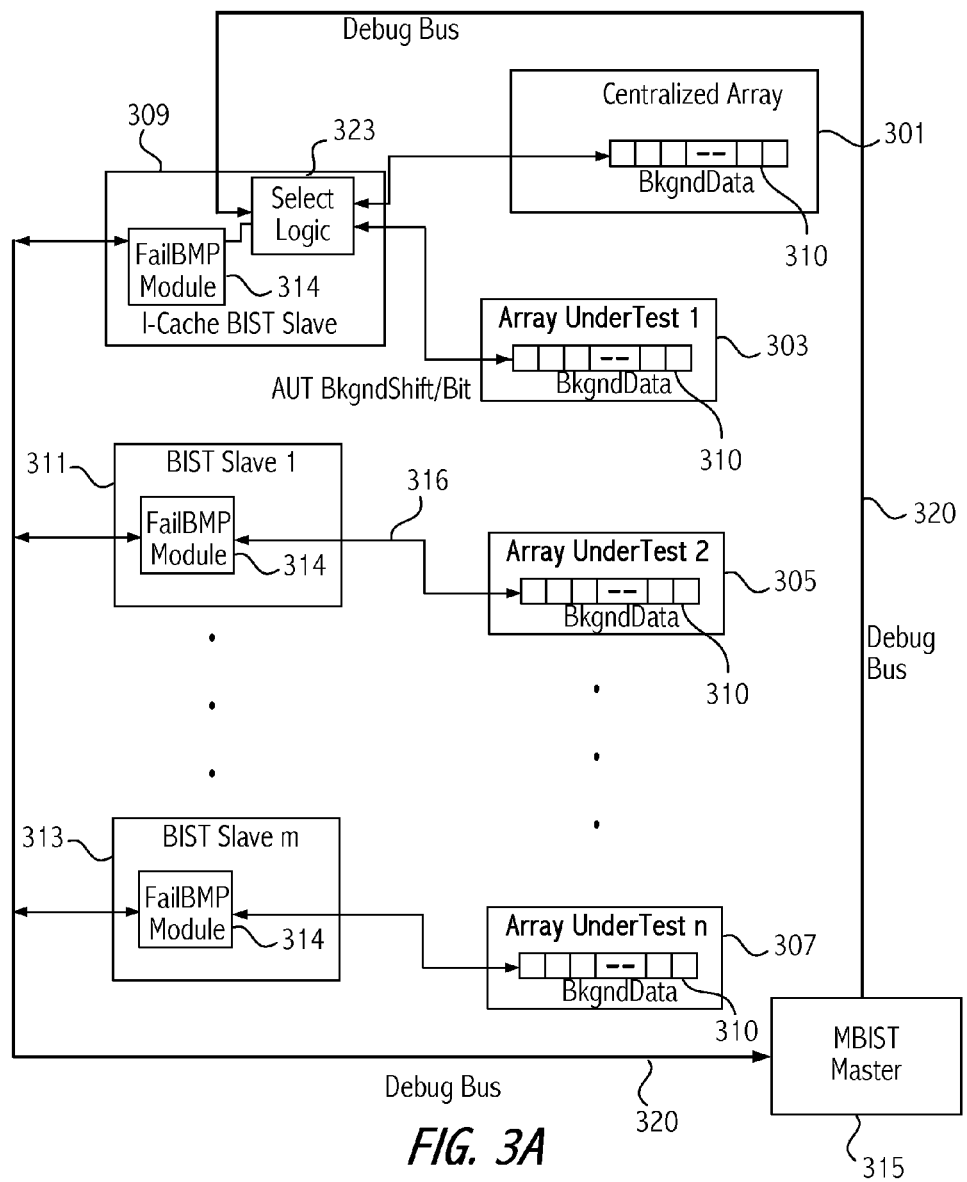
FIG. 3A illustrates an exemplary test architecture according to an embodiment of the invention.

Referring to FIG. 3A, illustrated is a simplified block diagram of an exemplary test architecture according to an embodiment of the invention. Each of the arrays 301, 303, 305 and 307 has an associated memory built-in self-test (MBIST) slave logic, (MBIST slave) 309, 311, 313. Some MBIST slaves may control self-testing of more than one array. For example, FIG. 3 shows MBIST slave 309 controls testing of multiple arrays, in particular, arrays 301 and 303. The MBIST slaves may include appropriate state machine(s) and associated combinational logic to implement the functionality described herein. The MBIST slaves are designed to control the reading and writing of the array and supply the data to the array in place of the normal operational logic. Some of the normal operational circuitry may be used in MBIST slaves or may be bypassed completely. The MBIST slaves 309 through 313 receive MBIST commands from MBIST master 315. The MBIST master provides the slaves with the test data to be written to a staging register in the array (BkgndData register) 310. The staging register may be a register used operationally or may be specifically designed for MBIST and provide, e.g., a shift capability to supply walking patterns of 1s and 0s through the arrays. The MBIST master also provides write commands, read commands, and compare data, along with commands at the completion of a self-test to cause the slave to write test information to the array under test and to the debug bus as described further herein. The MBIST master may include appropriate state machine(s) and associated combinational logic to implement the functionality described herein. As the functionality of the MBIST master is more complex, the state machines may be more complicated. Once the staging register (BkgndData) is written with the data to be written to the array, the MBIST master issues write commands with an address to the slaves to cause the MBIST slave to write to the array. Note that the address can be auto incrementing either in the slave or the array, and thus only an initial address may be provided by the MBIST master. Note that for some arrays, the data read may be inverted from the data written. Thus, the MBIST master, MBIST slave, or the array may provide appropriate inversion to be stored in the BkgndData register (or elsewhere) for comparison with the read data.

Figure 3B:
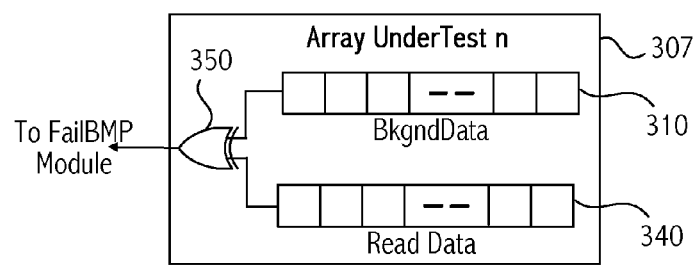
FIG. 3B illustrates additional details of an exemplary array.

In one embodiment shown in FIG. 3B, the array has a comparator 350 that during self-test compares data read from the array 340, resulting from a read operation, with the data in BkgndData register 310. The comparator provides a signal indicating the results of the compare. For example, the comparator 350 functions as an XOR and indicates a 0 when the written and read data are equal, and a 1 when there is a miscompare. The output of the comparator is supplied to the Fail Bit Map (FailBMP) module 314 that monitors the output for miscompares. When a miscompare occurs, the FailBMP module collects information such as the location of the failure in the array and the details of the data miscompare for later storing that information back into the arrays (the array under test and the centralized array).

After a self-test is completed, if a failure is indicated for a repairable array, the MBIST master causes a repair to be made to the array. Repairable arrays have redundant structures, such as cells or columns that can be switched in to replace the failed location(s). Thus, the MBIST instructions cause the appropriate redundant structure to be switched in based on the failure and the repairable nature of the array. Once the repair is made, the MBIST is then run again to verify the repair. The failure and the repair information, e.g., what column was replaced and by what spare column, is stored by the slave into the array as described further herein.

Note that a particular implementation has been described with relation to a high-level diagram of a testing architecture. The exact capabilities of the MBIST master, MBIST slave, and the array depends upon the capabilities of each. For example, the more autonomous the array is in running MBIST, the fewer capabilities are required of the MBIST master and slave. Further, it may be possible to have some arrays with greater MBIST capabilities and some requiring more external control and direction. For example, some arrays may not be able to perform a compare operation and the compare circuitry may be external to the array in, e.g., the slave, the master or elsewhere.

In an embodiment, at the end of MBIST operations, the test information including failure information and any repair information is written back to the array under test. The same failure information is also sent over communications bus 320 to the MBIST master 315, which causes the failure information to be forwarded to the centralized array location 301. Note that the failure information includes such information as whether the array passed or failed the self test, which bits failed and the location in the array of the failure, the pattern that was written and read, the total number of failures and repair data such as the column that was replaced and which spare column was used if there is more than one. The failure and repair information described is exemplary and other information or less information may be provided in any particular embodiment.

In the illustrated embodiment in FIG. 3A, the centralized array location is the array 301, which may be, e.g., an instruction cache, although any array that is suitably large enough to handle the MBIST failure and repair information for the arrays of the integrated circuit may be utilized. If the failure information is stored only in each separate array under test, that requires individual array accesses to access the information which takes significant time and effort. However, centralizing the repair and failure information allows efficient access for data mining during silicon bring-up. Additionally, providing centralized MBIST failure and repair information enables production engineers to more easily obtain repair information for all repairable arrays. In order to perform array repair without a centralized approach, the repair data needs to be obtained from each repairable array. With a centralized approach, an array dump of the centralized storage array is sufficient to obtain all necessary repair information for all repairable arrays, rather than having to individually read all the repairable arrays. That helps reduce test time during production and thus saves significant test and production costs.

In an embodiment explained further herein, the test information including the failure and repair information is written to the array under test, where possible, in addition to the centralized array. That approach provides duplicate back-up storage of MBIST information for the arrays. In addition, centralizing a location for storing MBIST information is particularly useful for special arrays that cannot hold the information themselves. For example, some arrays are too small, e.g., an array width less than 8 bits, to hold failure information or some arrays may have a special design property, such as hard-coded bit(s) or undefined bits, that prevent writing the failure information to these arrays. Since these special arrays cannot hold the test information, there was no test information available stored in the integrated circuit in prior approaches to help debug/diagnose these special arrays during bring-up or yield ramp.

Figure 4:
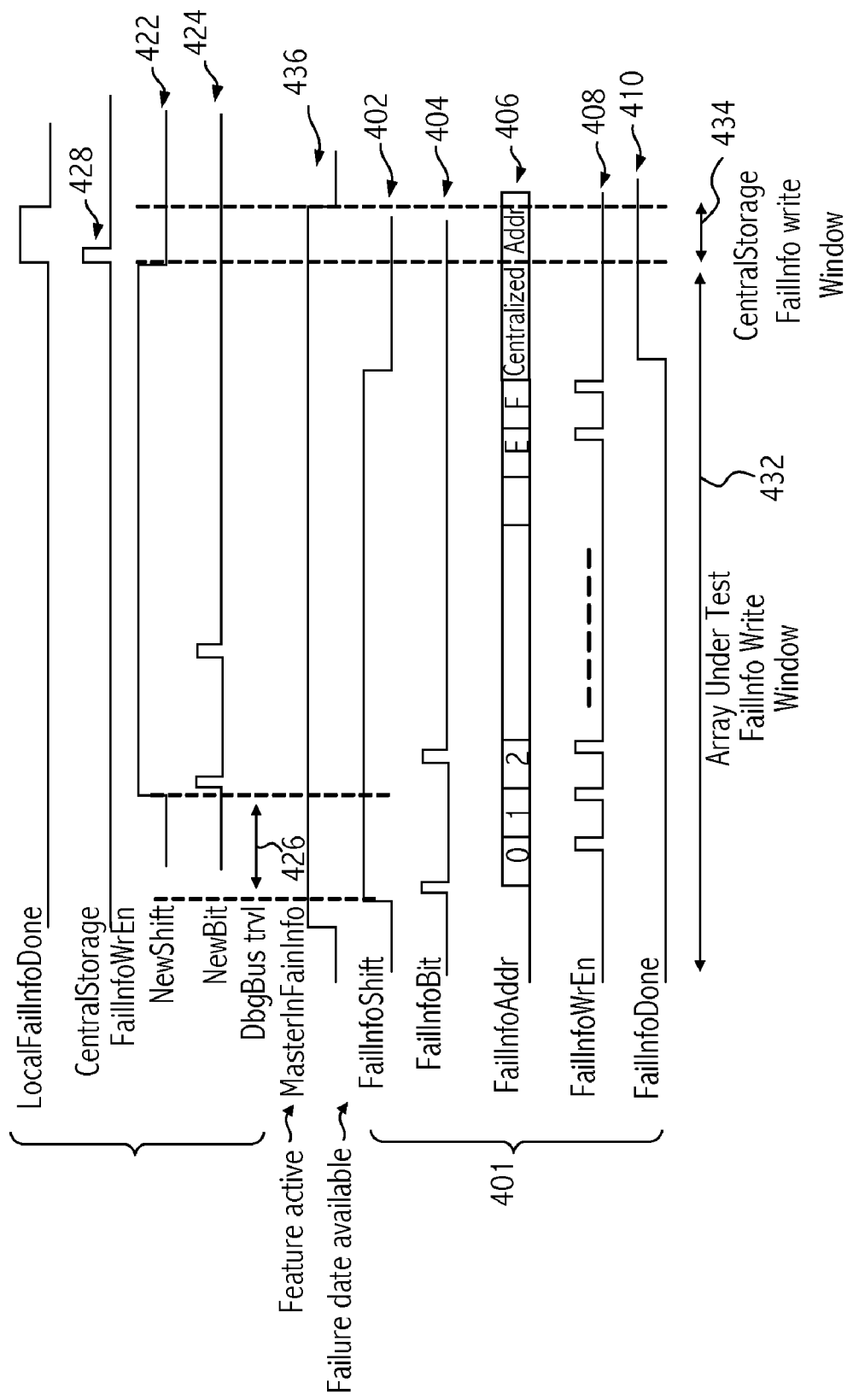
FIG. 4 illustrates a timing diagram illustrating timing of transfers of test information according to an embodiment of the invention.

Referring now to FIGS. 3 and 4, the timing of an exemplary embodiment is illustrated. Assume MBIST slave 311, responsive to command(s) from MBIST master 315, has caused a self-test to be executed for array 305. At the end of MBIST operations, the slave, since the FailBMP module 314 monitored the testing through the compare output, and being provided any repair information, has the fail and repair information necessary to write to the array under test. That information is written back to the array under test by the MBIST slave 311 and is also written to debug bus 320. Exemplary timing of the operation is shown in FIG. 4. Those portions 401 of the timing diagram relate to operations of the MBIST slave writing relevant test information back to the array under test, in this case, array 305 through communication path 316. The FailInfoShift signal 402 indicates when test information is being written to the array under test. The FailInfoBit signal 404 represents data bytes being written to the array under test. The FailInfoAddr signal 406 represents the address of the array under test to which the failure information is being written. In the embodiment illustrated in FIG. 4, there are sixteen addresses (shown in hexadecimal) with one byte of data per address for a total of 128 bits. The FailInfoWrEn 408 is a write enable signal for the various addresses. The FailInfoDone signal 410 indicates when the failure information write operation to the array under test has been completed.

While the write operation is occurring to store the failure information back to the array under test, the same test information (failure and repair data) is being sent onto the communications bus 320 for delivery to the MBIST Master 315, where it gets forwarded to the centralized storage 301 through MBIST slave 309. The timing diagram in FIG. 4 shows that the assertion of the NewShift signal 422 indicates that the shift operation on bus 320 is occurring to transfer the data to centralized array 301 through MBIST slave 309. The test information bytes are shown on NewBit signal 424. In the illustrated embodiment, there is a delay between when the data is being written to the array under test and the time it is available at the array 301. That delay is illustrated as interval 426. Once the failure data has been transferred through the MBIST slave 309 to the staging register (BkgndData) in the centralized array 301, a write enable (CentralStorageFailInfoWrEn) at 428 stores the data into the centralized array 301. The array under test (AUT) write window is shown at 432 and the centralized storage write window is shown at 434. Because of the size of the centralized array, the entire test information record of 128 bits (16 bytes) may be written at once and thus only a single write enable 428 is needed. The address in the centralized array corresponding to the particular array whose test information is being stored is specified as Centralized Addr as shown in 406. Such an address is provided by the MBIST master to the slave and corresponds to the location in the centralized array that is designated to store test information for the array under test. As with other information written to the array, the MBIST master issues a write command once the data has accumulated to be written to the array. Thus, the test information including failure and repair information is not only written to the array under test itself, but that same information is also written to and stored in the centralized storage array as a duplicate copy. While the identification of the array corresponding to the test information may be determined from the location in the centralized array into which it is written, in other embodiments, the information written to the centralized array may include an identification of the array (e.g., in a 9 bit field) to which the test information corresponds.

Referring still to FIG. 4, the MasterInFailInfo signal line 436 provides a control signal for select logic 323 in MBIST slave 309. In that way, the MBIST slave knows to source write data for the centralized array 301 from the communications bus 320 rather than from the FailBMP module 314. FailInfoDone 410 indicates that the failure information write operation to the array under test is complete and the write to the centralized array can be completed.

The process shown in FIG. 4 is performed for each of the arrays that has been tested. For those special arrays not capable of storing test information, the portion of the timing diagram illustrating writing to the array under test is not performed and the test information is just supplied to the centralized array. Further, for those arrays with no failures, there is no repair information to store as part of the test information and the repair information is a null.

Note that test information in the embodiment described in FIGS. 3 and 4 is written to the centralized storage array only after the local array under test has completed the failure information write operation. That is, the write operations are mutually exclusive in terms of timing to avoid collision of information that may occur when, e.g., MBIST slave 309 is writing test information to array 303.

Figure 5:
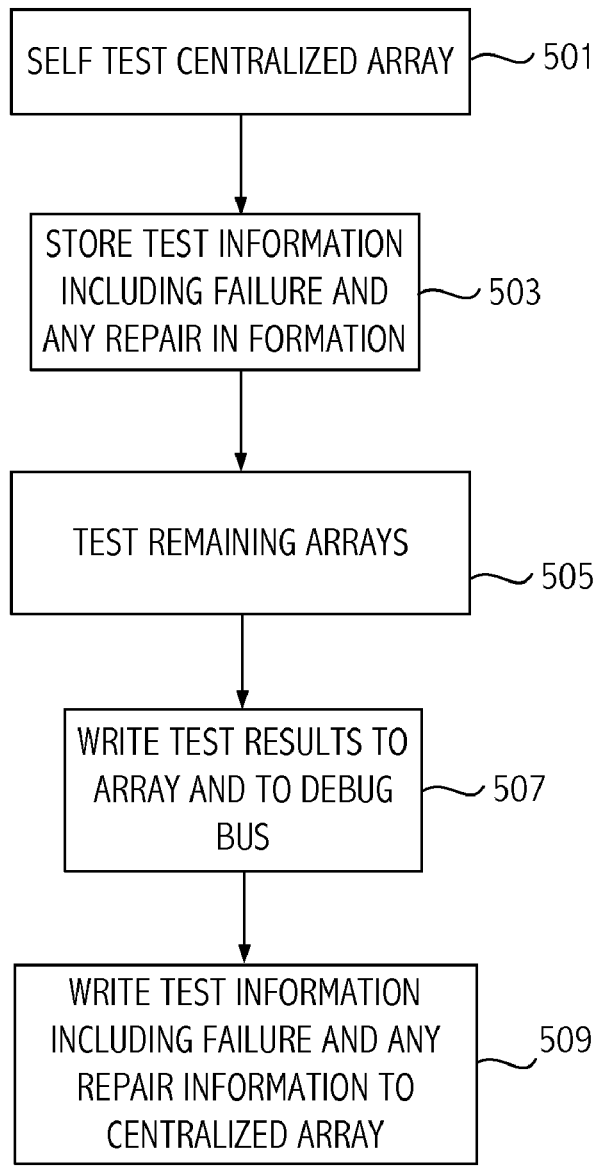
FIG. 5 illustrates a flow chart illustrating a high-level flow chart of an embodiment of the invention.

Referring now to FIG. 5, illustrated is an overall flow diagram of an embodiment of the invention. At 501, the centralized array is self-tested. If there are any failures, the MBIST master effects appropriate repairs and retests. At 503, the test information including failure and any repair information is stored in the centralized array. After the centralized array testing is complete, the remaining arrays are tested in 505 and repaired and retested if necessary. Depending upon the capabilities of the MBIST master and slaves, the remaining arrays may be tested serially, in parallel, or in some combination in which some arrays are tested serially and some in parallel. At completion of the MBIST for the remaining arrays, either after each array is tested, or after all the arrays are tested, the test information including failure information and any repair information is written in 507 to the array under test and to the debug bus responsive to commands from the MBIST master. The MBIST master forwards the test results on the debug bus to the MBIST slave for the centralized array and the test information is written into the centralized array in 509.

Note that while use of a single array has been described for the centralized array above, in fact, other embodiments may utilize several centralized arrays. For example, each centralized array may store failure information related to particular type of array under test. Thus, one centralized array may store failure and repair information for a first type (or types) of array, and a second centralized array may store failure and repair information for a second type of array. In addition, or alternatively, the particular centralized array that is used for particular failure and repair information may depend on the location of the centralized array with respect to the array under test. The number of centralized arrays used may also be dependent on the number of MBIST masters available.

Figure 6:
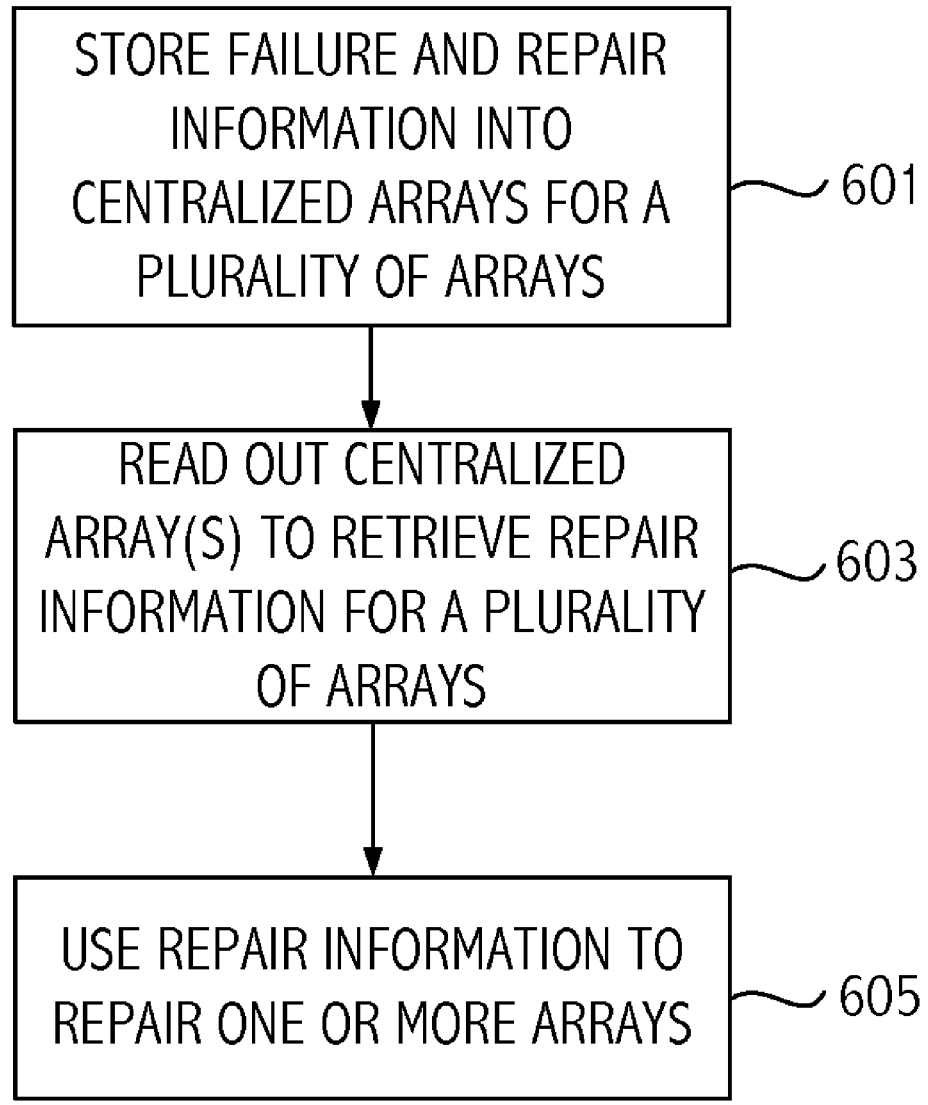
FIG. 6 illustrates a high-level flow chart of another embodiment of the invention.

Referring to FIG. 6, illustrated is a high-level diagram of use of the failure information in a centralized array to repair the arrays during the test and manufacturing process. In 601, the failure information is written to one or more centralized arrays as described above. In 603, the failure and repair information is retrieved for all repairable arrays from the centralized location(s) with an array readout of the centralized array. Then, in 605, the centralized repair information is used to repair one or more repairable arrays through the use of redundancy built into the arrays. Note that while MBIST repairs the memory and tests the repair to determine if the repair is effective, that repair is a soft repair in that it is not yet permanent. The repair information read from the centralized array(s) is used to permanently repair the array by programming appropriate repairs fuses to permanently swap out the defective column. Once the repair fuses are burned, MBIST should run fault-free, and the repair information saved for this MBIST will be null.

The centralized array for failure and repair information approach allows simpler array readout of the centralized array(s) to obtain all necessary repair information for all repairable arrays. That helps reduce test and repair time during production and thus provides significant savings in test and production costs.

While a master/slave test architecture has been described above, the centralizing of testing information can be accomplished with other test architectures. For example, each slave shown in the figures herein could in fact be an autonomous self-test controller, and the test information including failure and repair information could then be written over a communications interface to a central storage location. Storing the results centrally provides advantages described herein that is independent of the test architecture.

While circuits and physical structures are generally presumed for some embodiments of the invention, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

Thus, various embodiments have been described as using a centralized storage for test information for arrays while also maintaining test information in the local arrays. Note that the description of the invention set forth herein is illustrative, and is not intended to limit the scope of the invention as set forth in the following claims. Variations and modifications of the embodiments disclosed herein may be made based on the description set forth herein without departing from the scope of the invention as set forth in the following claims.

What is claimed is:

1. A method comprising:
   storing test information including at least one of failure information and repair information associated with one or more storage arrays, resulting from testing a plurality of storage arrays in an integrated circuit, into a centralized array in the integrated circuit; and
   writing the test information associated with the one or more storage arrays respectively into the one or more of the storage arrays, in addition to the centralized array.

2. The method as recited in claim 1 further comprising writing respective portions of the test information to a communication channel concurrently with writing the respective portions to the one or more storage arrays.

3. The method as recited in claim 2 further comprising a master test control function coupled to the communication channel receiving the respective portions of the test information and forwarding the respective portions to the centralized array through a slave test control function coupled to the centralized array.

4. The method as recited in claim 3 selectively coupling the communication channel to the centralized array to write data from the communication channel to the centralized array, thereby storing test information from the plurality of arrays into the centralized array.

5. The method as recited in claim 1 wherein the centralized array is an instruction cache.

6. The method as recited in claim 1 further comprising performing a built-in-self-test on the centralized array prior to self-testing any of the storage arrays.

7. The method as recited in claim 1 further comprising for one or more of the storage arrays, writing test information into the centralized array and not into the one or more of the storage arrays.

8. The method as recited in claim 1 further comprising retrieving the test information from the centralized array and using the test information to permanently repair one or more of the arrays.

9. The method as recited in claim 1 wherein the centralized array is a first centralized array and the method further comprises using the first and at least a second centralized array to store test information from memory built-in-self-test from arrays other than the first and second centralized array.

10. A method of manufacturing an integrated circuit comprising:
    writing test information including failure and any repair information resulting from testing a plurality of storage arrays in the integrated circuit into a centralized storage array in the integrated circuit;
    writing the test information associated with respective ones of the storage arrays into respective ones of the storage arrays, in addition to the centralized array;
    retrieving the test information from the centralized array; and
    using the retrieved test information to repair one or more of the arrays.

11. An integrated circuit comprising:
    a first plurality of storage arrays and a second storage array;
    a plurality of first test control logic circuits, each respectively coupled to supply test patterns to the first plurality of storage arrays;
    a second test control logic circuit coupled to supply test patterns to the second storage array; and
    wherein the second test control logic circuit is selectively coupled to supply test information resulting from testing of the first plurality of storage arrays to the second storage array.

12. The integrated circuit as recited in claim 11 further comprising:
    a master test control logic circuit; and
    a communications bus coupling the master test control logic circuit to the plurality of first test control logic circuits and to the second test control logic circuit.

13. The integrated circuit as recited in claim 12 wherein the master test control logic is responsive to receipt of the test information from the first test control logic circuits over the communications bus, to forward the test information to the second test control logic circuit.

14. The integrated circuit as recited in claim 12 wherein the second test control logic circuit comprises:
    a select circuit coupled to select between data from the second test control logic circuit and data from the communications bus to be supplied to the second storage array.

15. The integrated circuit as recited in claim 12 wherein one or more of the first test control logic circuits are configured to write respective test information associated with one or more of the storage arrays, to the communications bus without writing the respective test information to the one or more storage arrays.

16. The integrated circuit as recited in claim 15 wherein the one or more storage arrays have special circumstances causing them to be unable to store the test results, the special circumstances including at least one of small size, and fixed or undefined values for one or more memory locations.

17. The integrated circuit as recited in claim 11 wherein the second storage array is a cache array.

18. The integrated circuit as recited in claim 11 wherein one or more of the first test control logic circuits are configured to write respective test information associated with respective ones of the arrays into the respective ones of the arrays.

19. The integrated circuit as recited in claim 18 wherein the first test control logic circuits are further operable to write the respective test information associated with respective ones of the arrays to a communications bus.

* * * * *